United States Patent [19]

Shannon

[11] Patent Number: 4,922,314
[45] Date of Patent: * May 1, 1990

[54] HOT CHARGE-CARRIER TRANSISTORS

[75] Inventor: John M. Shannon, Whyteleafe, England

[73] Assignee: U.S. Philips Corp., New York, N.Y.

[*] Notice: The portion of the term of this patent subsequent to Jan. 10, 2006 has been disclaimed.

[21] Appl. No.: 270,374

[22] Filed: Nov. 9, 1988

Related U.S. Application Data

[63] Continuation of Ser. No. 53,767, May 22, 1987, abandoned.

[30] Foreign Application Priority Data

May 23, 1986 [GB] United Kingdom ................ 8612604

[51] Int. Cl.$^5$ .................... H01L 29/205; H01L 29/72
[52] U.S. Cl. ........................................ 357/34; 357/16; 357/4
[58] Field of Search ............................. 357/34, 16, 4

[56] References Cited

U.S. PATENT DOCUMENTS

| 4,665,412 | 5/1987 | Ohkawa et al. ................ 357/4 |
| 4,682,196 | 7/1987 | Sakai et al. ................ 357/58 |
| 4,758,870 | 7/1988 | Hase et al. ................ 357/34 |

FOREIGN PATENT DOCUMENTS

| 59-208873 | 11/1984 | Japan ................ 357/34 |
| 61-131491 | 6/1986 | Japan ................ 357/34 |
| 2056165 | 3/1981 | United Kingdom ................ 357/34 |

Primary Examiner—Jerome Jackson, Jr.
Attorney, Agent, or Firm—Steven R. Biren

[57] ABSTRACT

Current flow through the base region of a hot charge-carrier transistor is by hot majority charge-carriers (i.e. hot electrons for a hot electron transistor) which are collected at a base-collector barrier. This barrier may be formed by a semiconductor region which is doped with an impurity of the opposite conductivity type (p type for a hot electron transistor) and which is sufficiently thin as to form a bulk unipolar diode with an adjacent part of the base region. In accordance with the invention, one or more layers of wider-bandgap semiconductor material (for example, gallium aluminum arsenide) are present within the collector region (for example, of gallium arsenide) to form one or possibly even a series of heterojunctions each providing an electric field which retards the hot charge-carriers in the collector region. The retarding field cools the hot charge-carriers after collection so reducing a tendency to create electron-hole pairs by ionization. By spacing the first heterojunction from the base-collector barrier, a high collector field is maintained in the narrow bandgap material in the immediate vicinity of the potential maximum of the collector barrier, thus maintaining a high collection efficiency.

8 Claims, 2 Drawing Sheets

HOT CHARGE-CARRIER TRANSISTORS

This is a continuation of application Ser. No. 053,767, filed May 22, 1987, now abandoned.

BACKGROUND OF THE INVENTION

This invention relates to hot charge-carrier transistors having a base region through which current flow is by hot majority charge-carriers, and relates particularly but not exclusively to hot electron transistors formed with monocrystalline gallium arsenide.

U.S. Pat. No. 4,149,174 and published United Kingdom patent application (GB-A) No. 2 056 165 disclose hot charge-carrier transistors comprising a base region through which current flow is by hot majority charge-carriers of one conductivity type. Barrier forming means forms with the base region an emitter-base barrier serving for injection of the hot charge-carriers of said one conductivity type into the base region. There is a semiconductor collector region of said one conductivity type. The base-collector barrier in these transistors is formed by a semiconductor barrier region which is doped with impurity of the opposite conductivity type and which is sufficiently narrow as to form with said semiconductor collector region a bulk unipolar diode for collecting the hot charge-carriers of said one conductivity type from the base region during operation of the transistor.

Related devices are shown in commonly-owned U.S. Pat. Nos. 4,797,722 and 4,843,447.

In order to obtain a high current gain from such a transistor, the hot charge-carriers injected into the base region should have a high energy compared with the barrier height of the base-collector barrier. For this reason it is usually desirable to make the energy difference between the barrier heights of the emitter-base and base-collector barriers as large as possible.

However the present invention is based on a recognition by the present inventor that, as the height of the emitter-base barrier approaches the bandgap of the semiconductor material of the collector region, some of the hot charge-carriers which pass into the collector region can create electron-hole pairs by ionization (particularly with a large base-collector bias voltage applied); that the minority carriers thus generated can reduce the speed of the transistor by being stored in the base-collector barrier region (and possibly emitter-base barrier region); and that such ionization can be reduced (and even substantially eliminated) by cooling the hot charge-carriers in the collector region by means of a retarding electric field at a heterojunction associated with the collector region.

SUMMARY OF THE INVENTION

Thus, according to the present invention there is provided a hot charge-carrier transistor comprising a base region through which current flow is by hot majority charge-carriers of one conductivity type, barrier forming means which forms with the base region an emitter-base barrier serving for injection of the hot charge-carriers of said one conductivity type into the base region and a base-collector barrier for collecting the hot charge-carriers of said one conductivity type from the base region, the transistor having a semiconductor collector region of said one conductivity type and being characterized in that semiconductor material of a wider bandgap is present within the collector region to form in the vicinity of the base-collector barrier a heterojunction into the wider bandgap material, the heterojunction providing an electric field which retards the hot charge-carriers in the collector region in the vicinity of the base-collector barrier.

The heterojunction may be formed at the interface of the base-collector barrier and the collector region. However in order to maintain a high collection efficiency, the heterojunction is preferably spaced from the base-collector barrier. Thus, the heterojunction may be formed between the wider bandgap material and a part of the collector region which is of narrower bandgap material and which spaces the heterojunction from the base-collector barrier. This spacer part of the collector region which is of said one conductivity type and a base-collector barrier region are both preferably of the same narrow bandgap material as each other so as to reduce quantum mechanical reflections of the charge-carriers at the interfaces.

These and other features in accordance with the present invention are illustrated more specifically in embodiments of the invention now to be described, by way of example, with the accompanying diagrammatic drawings, in which.

Figure 1:
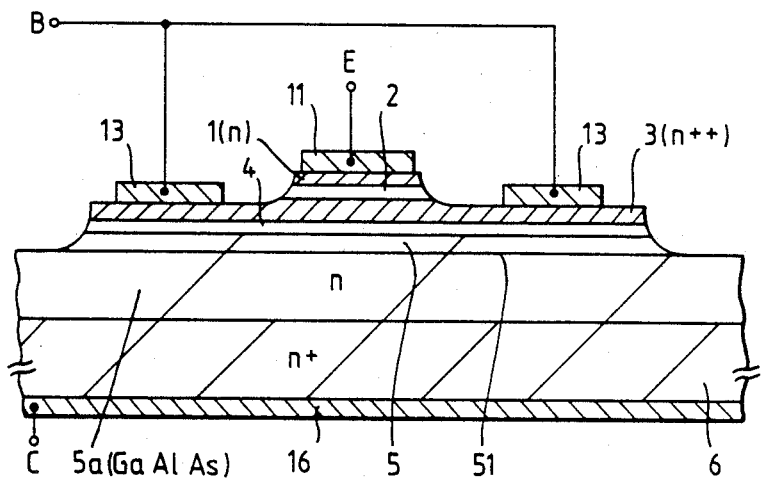
FIG. 1 is a cross-sectional view of part of a semiconductor body comprising a hot electron transistor in accordance with the invention.

It should be noted that all the Figures are diagrammatic and not drawn to scale. The relative dimensions and proportions of parts of these Figures (particularly in the direction of thickness of layers) have been shown exaggerated or diminished for the sake of clarity and convenience in the drawings. The same reference signs as used in one embodiment are generally used when referring to corresponding or similar parts in other embodiments. The thin depleted emitter-base and base-collector barrier regions are not hatched in the cross-section of FIG. 1.

DESCRIPTION OF THE PREFERRED EMBODIMENT

FIG. 1 illustrate one particular structure for a hot charge-carrier transistor in accordance with the invention. The device is a hot electron transistor, having an n type base region 3 through which current flow is by hot electrons. However it will be appreciated that the invention may be used in the construction of a hot hole transistor having opposite conductivity type regions to the corresponding regions of a hot electron transistor. Hot charge carriers are those which are not in thermal equilibrium with the lattice. Thus, the average energy of hot electrons is considerably more than a few k.T above the average energy of electrons in equilibrium with the lattice (where k and T are the Boltzmann constant and the lattice temperature respectively). At room temperature k.T is about 25 meV.

The transistor illustrated in FIG. 1 comprises a monocrystalline semiconductor body including semiconductor regions 1 to 5, 5a and 6. The region 2 forms an emitter-base barrier with the n type base region 3, serving for injection of hot electrons into the base region 3.

The n type regions 5, 5a and 6 form a semiconductor collector region of the transistor. A semiconductor barrier region 4 provides the base-collector barrier and may be of the same bandgap material as the base region 3 and the adjacent part 5 of the collector region. In a preferred form which provides good adjustable control of the base-collector barrier height, the region 4 is doped with impurity of the opposite conductivity type (p type) to that of the hot charge-carriers (electrons) and is sufficiently narrow as to form with the semiconductor collector region 5, 5a and 6 a bulk unipolar diode for collecting the hot electrons from the base region 3 during operation of the transistor.

In accordance with the present invention (and unlike the similar hot electron transistor illustrated in FIG. 6 of GB No. 2 056 165) semiconductor material 5a of a wider bandgap is present within the collector region 5, 5a and 6 to form a heterojunction 51 providing an electric field which retards the hot electrons in the collector region 5, 5a and 6 in the vicinity of the base-collector barrier region 4. The bandgap of the material 5a is wider than that of the semiconductor material of the base-collector barrier region 4 and of the collector region part 5 which spaces the heterojunction 51 from the base-collector barrier region 4. With this arrangement a high collector field is maintained in the part 5 in the immediate vicinity of the potential maximum of region 4 serving for efficient collection of the hot electrons, and the collected hot electrons are then cooled by the retarding field at the heterojunction 51 so reducing a tendency to create electron-hole pairs by ionization in the collector region and thus reducing hole trapping and storage in the base-collector barrier region 4. In a particular example, the regions 4 and 5 may be of gallium arsenide, and the region 5a may be a mixed crystal of gallium aluminum arsenide. The retarding field for electrons is provided by the abrupt conduction band step (see FIG. 2) at the heterojunction 51. Preferably the valence band step in the material 5a is small so that any minority carriers can flow unimpeded through the collector region and not be stored at the heterojunction interfaces. With a heterojunction between GaAs and $Ga_{0.6}Al_{0.4}As$, the valence band step is only about 0.15 eV whereas the conduction band step which produces the retarding field for the hot electrons is about 0.35 eV.

Figure 2:
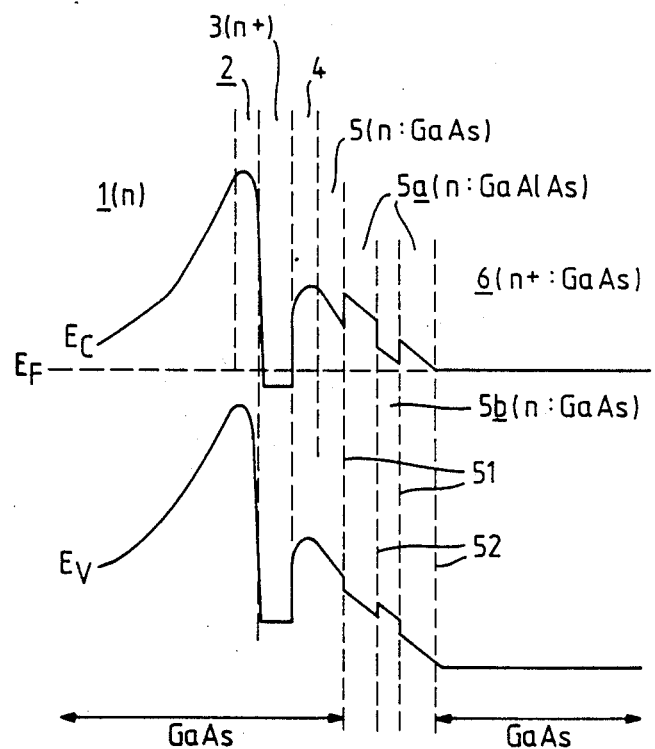
FIG. 2 is an energy diagram through the active part of a transistor in accordance with the invention and similar to that of FIG. 1, showing both conduction and valence band edges $E_c$ and $E_v$ respectively.

A series of mutually spaced layers 5a of the wider bandgap material may be present within the collector region to form a series of abrupt heterojunctions 51 providing electron-retarding electric fields. FIG. 2 illustrates two such layers 5a separated by narrow-bandgap material 5b (for example gallium arsenide). However, more layers 5a and 5b may be incorporated. The intermediate layer 5b forms a reverse heterojunction 52 with the overlying layer 5a. Thus, in such a series, the heterojunction nearest the base-collector barrier 4 (i.e. heterojunction 51 between narrow-bandgap material 5 and wide-bandgap material 5a) retards the hot electrons after collection; the second heterojunction (reverse heterojunction 52 between 5a and 5b) accelerates the retarded electrons but they are then retarded again by the next heterojunction (51 between 5b and 5a), and so on. The layers 5a can be made sufficiently thick that the retarded hot electrons lose more energy therein before reaching the heterojunction 52. A graded composition (and hence a graded bandgap) may be employed between an underlying layer 5b and an overlying layer 5a to reduce or remove the effect of such a reverse heterojunction 52, and in this case the layers 5a may be thinner.

The base-collector barrier region 4 may be formed, for example, by a bulk unipolar diode of the type described in U.S. Pat. No. 4,149,174. Thus, the region 4 may have a p type impurity concentration the magnitude of which determines the height of the potential barrier to the flow of electrons from the base region 3 to an n type collector region 5,6. The barrier region 4 is sufficiently thin that depletion layers which it forms at zero bias with both the base and collector regions merge together in the region 4 to substantially deplete the whole of the region 4 of holes even at zero bias. To obtain such depletion at zero bias, the thickness and doping level of the region 4 must satisfy certain conditions as described in U.S. Pat. No. 4,149,174, while the height of the barrier is determined by the doping level of the region 4. In the form illustrated in FIG. 1, the collector region comprises an n type epitaxial layer 5 on the wider bandgap material 5a on a highly doped n type monocrystalline substrate 6 with a metal layer 16 providing a collector electrode.

The emitter-base barrier 2 may be formed in known manner in a variety of ways. Preferably it comprises a doped semiconductor barrier region 2 forming a bulk unipolar diode as illustrated in FIGS. 1 and 2. Its barrier height is determined by its doping level of impurity of opposite conductivity type (p type) to that of the hot charge-carriers (electrons) which it serves to inject into the n type base region 3. This barrier region 2 is sufficiently thin to be depleted of holes at least during operation of the transistor. It may be such as to be undepleted over a part of its thickness at zero bias, as for example with the emitter-base barrier regions described GB No. 2 056 165. However it may be depleted over the whole of its thickness even at zero bias, as with the barrier regions described in U.S. Pat. No. 4,149,174.

The base region 3 in the form illustrated in FIGS. 1 and 2 comprises a single highly-doped n type semiconductor region (n++) with a metal layer 13 providing a base electrode. In the particular form illustrated by way of example in FIGS. 1 and 2 the transistor has a low-doped n type emitter region 1 with which a metal layer 11 forms an ohmic contact to provide an emitter electrode.

The transistors of FIGS. 1 and 2 may be formed with, for example, a monocrystalline gallium arsenide substrate 6 on which an n type gallium aluminum arsenide epitaxial layer is grown (for example using molecular-beam epitaxial growth) to provide the wide-bandgap collector region layer 5a. The desired number of gallium aluminum arsenide layers 5a and intermediate gallium arsenide layers 5b are similarly grown. Then molecular beam epitaxy of gallium arsenide may be used to form appropriately doped layers for the n type collector region layer 5, the p type doped barrier region 4, the n type base region 3, the p type doped barrier region 2 and then the final n type layer for the emitter region 1. The two upper layers 1 and 2 are locally removed throughout their thickness by etching to leave the emitter mesa structure illustrated for the regions 1 and 2 in FIG. 1, after which the two layers 3 and 4 and at least part of the layer 5a are also locally removed throughout their thickness to leave the base mesa structure illustrated for the regions 3 and 4 in FIG. 1. The emitter, base and collector connections 11, 13 and 16 are then provided.

In a typical specific example the transistor may have the following thicknesses and doping concentrations for the regions 1 to 5a:

GaAs emitter region 1: about 200 nm (nanometers) thick,
doped with about $10^{16}$ silicon or tin atoms cm$^{-3}$
GaAs region 2 : about 20 nm thick,
doped with about $3 \times 10^{18}$ beryllium atoms cm$^{-3}$
GaAs base region 3 : about 25 nm thick,
doped with about $5 \times 10^{18}$ silicon atoms cm$^{-3}$
GaAs region 4 : about 15 nm thick,
doped with about $3 \times 10^{18}$ beryllium atoms cm$^{-3}$
GaAs collector region 5 : about 50 nm thick,
doped with about $10^{16}$ silicon atoms cm$^{-3}$
GaAlAs collector regions 5a : about 20 nm thick,
doped with about $10^{16}$ silicon atoms cm$^{-3}$
GaAs collector region 5b : about 20 nm thick
doped with about $10^{16}$ silicon atoms cm$^{-3}$ Aluminum arsenide mole fraction of about 0.4 may be used for the region 5a adjacent the heterojunction 51, this AlAs mole fraction decreasing progressively from the layer 5a into the underlying layer 5b to avoid an abrupt reverse heterojunction 52. With such a composition the retarding potential barrier formed by the conduction band step at the heterojunction 51 is about 0.35 eV. Such a hot electron transistor can be operated satisfactorily at room temperature (300° K.).

The termination of the mesa etching for the regions 3 and 4 is not critical due to the large thickness of the collector layers 5 and 5a. The base region 3 is however of comparatively small thickness so that the etching process for defining the emitter mesa 1 and 2 must be terminated with sufficient control to avoid etching through the exposed base region 3. This can be facilitated by using wider bandgap material (for example, gallium aluminum arsenide) for the emitter-base barrier region 2 so as to be selectively etchable with respect to the adjacent (gallium arsenide) part of the base region 3 with which it forms a heterojunction 23. Several selective etchants are available for gallium aluminum arsenide on gallium arsenide, for example a wet etch solution of ammonia and hydrogen peroxide in water.

Figure 3:
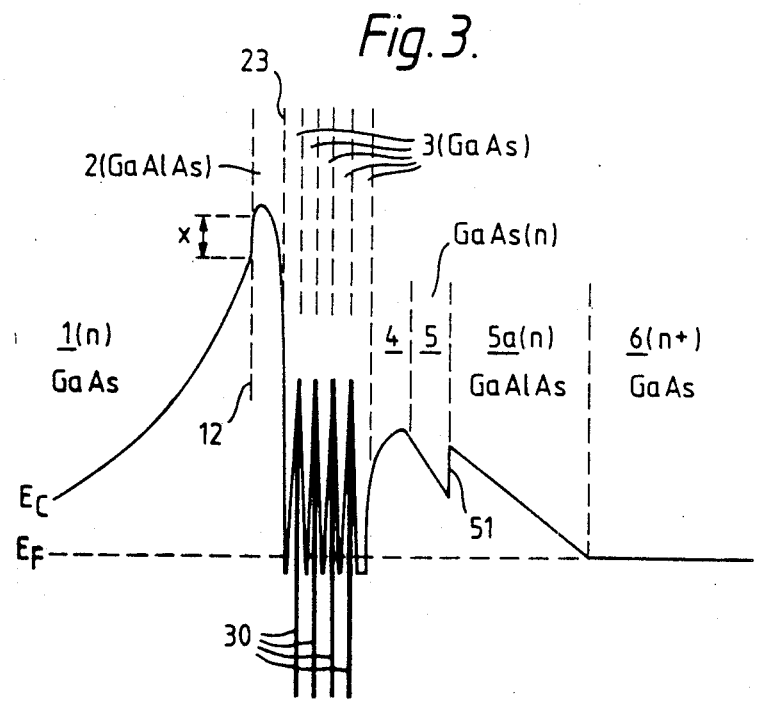
FIG. 3 is an energy diagram through the active part of another transistor also in accordance with the invention, showing the conduction band edge $E_c$.

FIG. 3 illustrates the effect of the heterojunction 23 on the conduction band edge $E_c$. The heterojunction 23 increases the barrier height of the emitter-base barrier region 2 by an amount x. However, the proportion of the total barrier height determined by the p type impurity doping of the region 2 is larger than x. Thus, x is about 0.35 eV for a heterojunction 23 between $Ga_{0.6}Al_{0.4}As$ and GaAs. A valence band step giving a higher hole energy in the barrier region 2 than in the adjacent regions is also formed at the heterojunction 23, and in the particular example of a GaAs base region 3 and a $Ga_{0.6}Al_{0.4}As$ barrier region 2, the valence band step is about 0.15 eV. Thus, in this particular example with a total barrier height for electrons of about 0.95 eV, the corresponding well for holes is only about 0.6 eV, thus reducing the tendency for holes (i.e. minority carriers in the device) to be trapped and stored in the emitter-base barrier region 2 of a given height.

In the arrangement illustrated in FIG. 3 the depleted p type doped barrier region 2 of wide bandgap material also forms a heterojunction 12 with the n type emitter region 1 of, for example, GaAs. Thus, x is the same on both the emitter and base sides of the region 2. However, the emitter region 1 may be of wide bandgap material, for example the same gallium aluminum arsenide material as the barrier region 2; this increases the emitter resistance. The material of the emitter region 1 may also be a graded composition with an AlAs mole fraction varying progressively from a layer of gallium arsenide adjacent the top surface to gallium aluminum arsenide at the interface 12 with the AlAs mole fraction of the barrier region 2.

Furthermore the emitter region 1 may be of opposite conductivity type (p type in these examples) to that of the base region 3 and be sufficiently low doped as to form a Schottky barrier with an emitter electrode 11. It is also possible for very thin, intrinsic (i.e. undoped or unintentionally doped) semiconductor layers to be present between the depleted p type doped barrier region 2 and the emitter and base regions 1 and 3 and between the depleted p type doped barrier region 4 and the base and collector regions 3 and 5. The semiconductor emitter region 1 may be omitted when a Schottky electrode 11 is provided.

A further modification which may be included in a hot carrier transistor in accordance with the invention is also illustrated in FIG. 3. Thus, at least one metal-based layer 30 may be included in the base region 3 parallel to the barrier region 4 to reduce the base resistance. In order to aid efficient transmission of the hot charge-carriers through the base region 3 and 30, the metal-based layer 30 is very thin (for example about 1 nm thick) to permit quantum mechanical tunnelling. When GaAs is used for the semiconductor region 3, the layer 30 may be of, for example, epitaxial aluminum. Very low base resistances can be obtained by incorporating thin metal-based layers 30 in the transistor base. A series arrangement of alternate layers of semiconductor material 3 and metal-based material 30 may be employed in the base region. In the transistor structure illustrated in FIG. 3, the nearest metal-based layer 30 is spaced from the emitter-base barrier 2. However the metal-based layer 30 nearest the barrier 2 may adjoin the barrier region 2 and may form a heterojunction with the first semiconductor part 3 of the base region. This heterojunction can provide within the base region an electric field serving to accelerate the hot charge-carriers in the base region towards the base-collector barrier 4.

We claim:

1. A hot charge-carrier transistor comprising a base region through which current flow is by hot majority charge-carriers of one conductivity type, barrier forming means which forms with the base region an emitter-base barrier for injection of the hot-carriers of said one conductivity type into the base region, and a base-collector barrier of a second conductivity type opposite to that of said first for collecting the hot charge-carriers of said one conductivity type from the base region, the transistor having a collector connection and a semiconductor collector region of said one conductivity type between the base-collector region of said one conductivity type between the base-collector barrier and the collector connection, the collector region being separated from the base region by the base-collector barrier, a region of semiconductor material of a wider bandgap being present within the collector region, said region of semiconductor material of wider bandgap being of said one conductivity type, located between the base-collector barrier of the second conductivity type and the collector connection, and forming in the collector region in the vicinity of the base-collector barrier a heterojunction at a surface of said wider bandgap material nearest said base-collector barrier, the heterojunction in operation providing an electric field which retards hot charge-carriers within the collector region in the vicinity of the base-collector barrier before these charge-carriers pass through the remainder of the collector region to the collector connection.

2. A transistor as claimed in claim 1, further characterized in that the heterojunction is formed between the wider bandgap material and a part of the collector region which is of narrower bandgap material and which is located between the heterojunction and the base-collector barrier, said part of the collector region being of said one conductivity type.

3. A transistor as claimed in claim 2, further characterized in that the base-collector barrier is formed by a semiconductor barrier region which is doped with impurity of the opposite conductivity type and which is sufficiently narrow as to form with said semiconductor collector region a bulk unipolar diode for collecting the hot charge-carriers of said one conductivity type from the base region, and that the bandgap of the wider bandgap material is larger than that of the semiconductor material of the base-collector barrier region.

4. A transistor as claimed in claim 3, further characterized in that the same bandgap semiconductor material is used both for the base-collector barrier region and for the part of the collector region which spaces the heterojunction from the base-collector barrier region.

5. A transistor as claimed in claim 1, 2, 3 or 4, further characterized in that a series of mutually-spaced layers of the wider-bandgap semiconductor material is present within the collector region to form a series of heterojunctions which provide retarding electric fields.

6. A transistor as claimed in claim 1, 2, 3 or 4, further characterized in that the base-collector barrier is formed with gallium arsenide, and that the wider bandgap material is gallium aluminum arsenide.

7. A transistor as claimed in claim 1, 2, 3 or 4, further characterized in that the base region comprises alternate layers of semiconductor material of said one conductivity type and of thin metal-based material of higher conductivity than the semiconductor material, the metal-based layers serving to reduce the electrical resistance while being sufficiently thin to permit quantum mechanical tunnelling.

8. A transistor as claimed in claim 7, further characterized in that the metal-based layer nearest the emitter-base barrier forms a heterojunction which provides within the base region an electric field serving to accelerate the hot charge-carriers in the base region towards the collector region.

* * * * *

UNITED STATES PATENT AND TRADEMARK OFFICE
CERTIFICATE OF CORRECTION

PATENT NO. : 4,922,314

DATED : May 1, 1990

INVENTOR(S) : John M. Shannon

It is certified that error appears in the above-identified patent and that said Letters Patent is hereby corrected as shown below:

In Column 6, line 54 - delete in its entirety.

In Column 6, line 55 - delete "tivity type"

Signed and Sealed this

Seventeenth Day of March, 1992

Attest:

HARRY F. MANBECK, JR.

*Attesting Officer*      *Commissioner of Patents and Trademarks*